United States Patent [19]

Lloyd et al.

[11] 4,054,238
[45] Oct. 18, 1977

[54] METHOD, APPARATUS AND LEAD FRAME FOR ASSEMBLING LEADS WITH TERMINALS ON A SUBSTRATE

[75] Inventors: Harold E. Lloyd, Merrimac; Joseph F. Pollitt, Bradford, both of Mass.

[73] Assignee: Western Electric Company, Inc., New York, N.Y.

[21] Appl. No.: 669,575

[22] Filed: Mar. 23, 1976

[51] Int. Cl.² .................................... H01L 21/60
[52] U.S. Cl. .............................. 228/173 R; 228/5.1; 228/6 A; 228/180 A; 429/584; 174/52 FP
[58] Field of Search ............... 29/576 S, 588, 626, 29/628, 193.5; 228/6 A, 180 A, 5.1, 173; 174/52 FP; 206/330, 343

[56] References Cited

U.S. PATENT DOCUMENTS

| 3,868,725 | 2/1975 | De Graaff | 174/52 FP X |
| 3,899,305 | 8/1975 | Hilgers et al. | 29/193.5 X |
| 3,902,003 | 8/1975 | Wheeler et al. | 29/193.5 X |
| 3,961,413 | 6/1976 | Noe | 228/6 A X |
| B 506,760 | 4/1976 | Wallick | 174/52 FP X |

OTHER PUBLICATIONS

Coby et al., "Spot Plating" Western Electric Technical Digest No. 34, Apr. 1974, pp. 7-8.

*Primary Examiner*—Al Lawrence Smith
*Assistant Examiner*—K. J. Ramsey
*Attorney, Agent, or Firm*—D. D. Bosben

[57] ABSTRACT

Each lead frame in a continuous strip of lead frames is formed with opposed pairs of integral and subsequently removable aligning tabs for locating a substrate on the lead frame such that leads of the lead frame and respective terminals on the substrate are in alignment. The aligning tabs initially are formed in the plane of the lead frame and subsequently are bent out of the plane of the lead frame so as to project from the lead frame for the reception of the substrate therebetween. The substrate is placed between the projecting tabs in an inverted position with the terminals on the substrate resting on inner free end portions of the lead frame leads. The lead frame then supports the substrate for movement through a series of processing stations, including a lead-terminal bonding station and a tab-removal station, as the continuous strip of lead frames is indexed in successive steps from a continuous lead frame supply.

18 Claims, 13 Drawing Figures

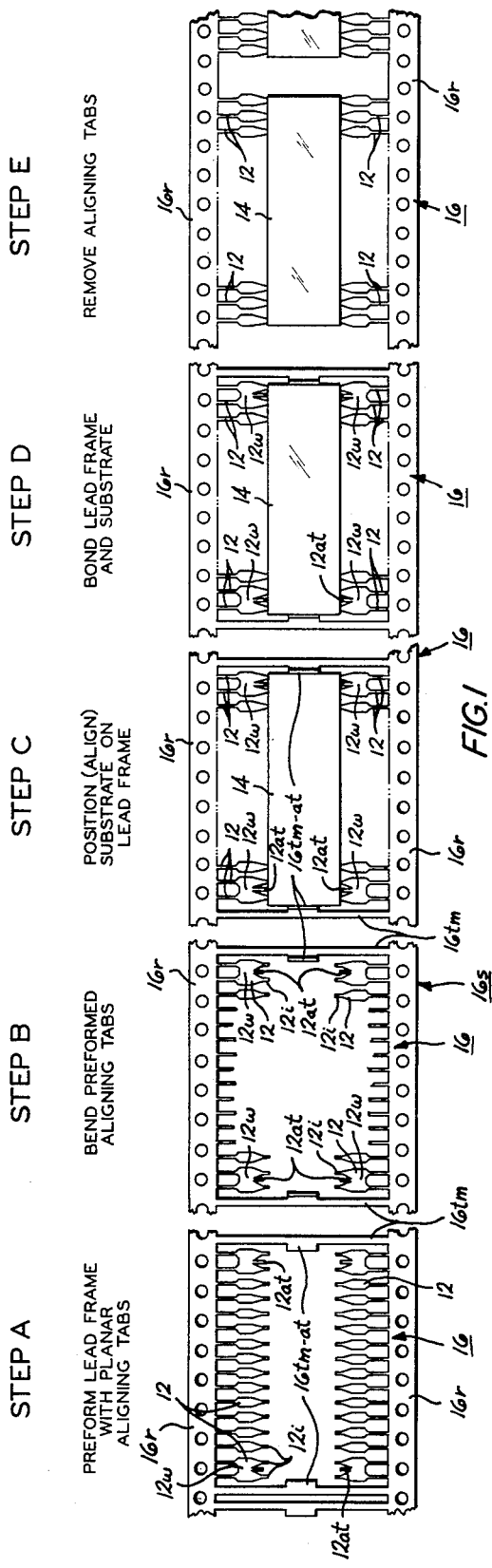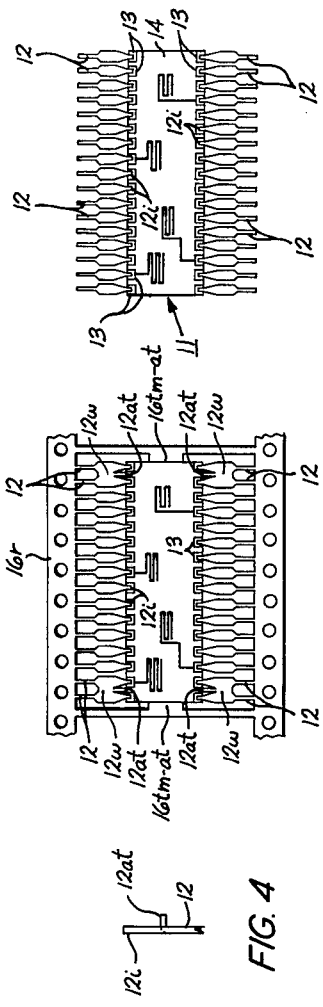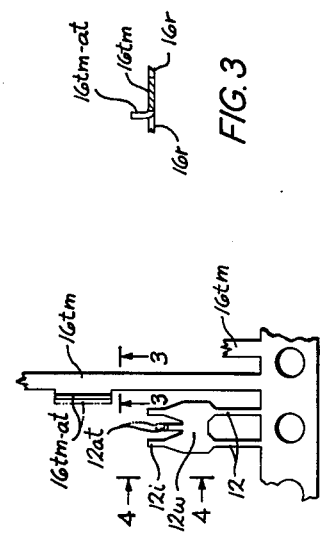

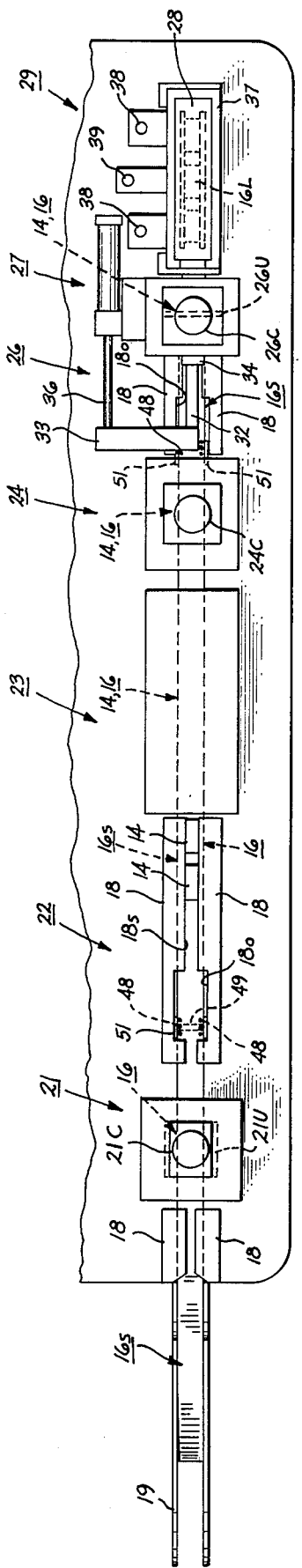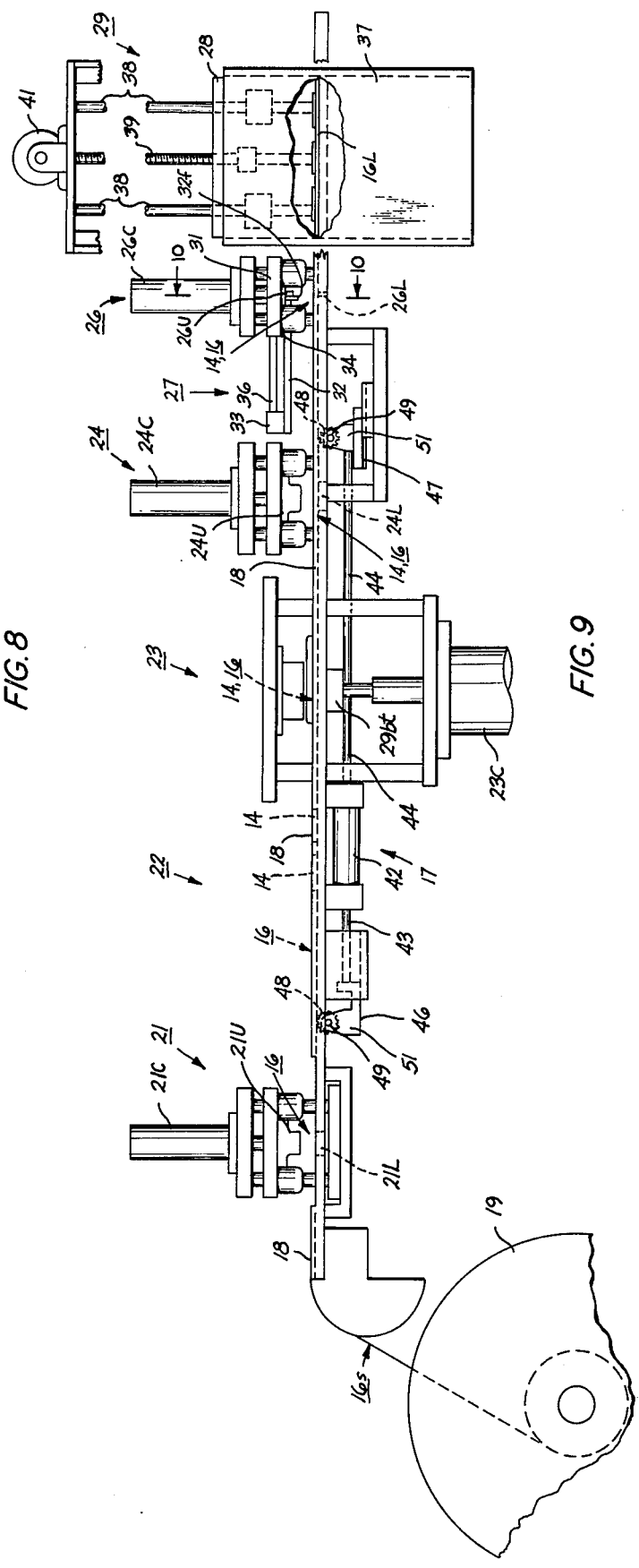
FIG. 8
FIG. 9

METHOD, APPARATUS AND LEAD FRAME FOR ASSEMBLING LEADS WITH TERMINALS ON A SUBSTRATE

BACKGROUND OF THE INVENTION

1. Field of the Invention

This invention relates to a method, apparatus and lead frame for assembling leads with terminals on a substrate, and more particularly to a method, apparatus and lead frame for assembling leads with terminals on a substrate in which removable substrate aligning tabs are formed integrally with each lead frame in a continuous strip of lead frames and in which the lead frame strip transports the substrates through a series of processing stations.

2. Description of the Prior Art

It is standard practice in the manufacture of electronic equipment, such as thin film circuit devices, to bond leads of a lead frame to terminals or bonding pads on a ceramic substrate in an operator attended position. In a known bonding operation, which utilizes individual separated lead frames, the operator initially positions the ceramic substrate into a nest with the edges of the substrate adjacent respective small rigid metal (e.g., steel) alignment pins embedded in a support block for locating the substrate in a desired position. Next, a lead frame is placed by the operator over the ceramic substrate and inner free end portions of the leads of the lead frame are manually aligned with the terminals on the substrate. A thermode of a substrate bonding tool then is brought downward into contact with the inner lead end portions to thermocompression bond them to the terminals. Subsequently, the resultant bonded lead frame-substrate assembly is manually removed from the bonding apparatus and the process is repeated.

The foregoing arrangement is undesirable in that it is relatively time consuming, laborious and subject to human error. The leads of the lead frame also are subject to contamination, bending or other damage as a result of the manual handling thereof. In addition, it is difficult to preheat the separate lead frames to facilitate the bonding of the substrates thereto, and thus the bonding apparatus must be operated at a high power level to achieve satisfactory bonds.

The above-described system also is disadvantageous in that the fixturing for receiving and aligning the ceramic substrates is expensive to fabricate, since the small metal alignment pins must be located therein with a high degree of accuracy. In this connection, however, the fixturing still is relatively inaccurate because the alignment pins cannot be located in spaced relationship exactly corresponding to the dimensions of the substrates, but must be located distances apart somewhat greater than the substrate dimensions to provide clearance between the pins and edges of a substrate positioned therein. Otherwise, the expansion of the substrate against the rigid alignment pins as the substrate absorbs heat during the bonding operation, could cause cracking of the substrate. Further, it has been found that the metal alignment pins tend to become worn by the edges of the ceramic substrate, which are relatively hard and abrasive in nature, such that the pins soon are no longer capable of locating one of the substrates in proper position below the thermode of the bonding tool with any degree of accuracy, whereby the pins must be frequently replaced.

In an attempt to increase production output, the use of fixturing having a plurality of substrate receiving and aligning positions, for processing a short length of a lead frame strip (e.g., 5 lead frames long), also has been utilized. Initially, the substrates are manually positioned into nests between respective sets of rigid metal alignment pins and the lead frame strip is manually located on the fixturing with leads of each lead frame aligned with bonding pads or terminals on respective ones of the substrates. The fixturing then is indexed into a bonding tool which bonds each of the lead frames to their respective substrates in sequence, after which the strip of bonded lead frames and substrates is manually removed from the apparatus and the process is repeated. This arrangement, however, still is subject to the other disadvantages noted above in connection with the use of separate lead frames, and the fixturing is considerably more expensive because of the multiple sets of accurately located alignment pins which are required.

SUMMARY OF THE INVENTION

In general, this invention involves assembling leads of a lead frame and respective terminals on a substrate, wherein aligning tabs are integrally formed on the lead frame in preselected spaced relationship such that they locate the substrate with its terminals in alignment with their respective leads when the substrate is engaged with the aligning tabs in a predetermined manner.

More specifically, each lead frame in a continuous strip of lead frames is formed with opposed pairs of integral and subsequently removable aligning tabs for locating a substrate on the lead frame such that leads of the lead frame and respective terminals on the substrate are in alignment. The aligning tabs initially are formed in the plane of the lead frame and subsequently are bent out of the plane of the lead frame so as to project from the lead frame for the reception of the substrate therebetween. The substrate is placed between the projecting tabs in an inverted position with the terminals on the substrate resting on inner free end portions of the lead frame leads, for bonding the leads to the terminals from below. Further, the lead frame then supports the substrate for movement through a series of processing stations, including a lead-terminal bonding station and a tab-removal station, as the continuous strip of lead frames is indexed in successive steps from a continuous lead frame supply.

BRIEF DESCRIPTION OF THE DRAWINGS

FIG. 1 is a plan view of a section of a continuous strip of lead frames in accordance with the invention, illustrating various processing steps in accordance with the invention;

FIG. 2 is an enlarged view of a portion of the lead frame strip shown in a processing step B of FIG. 1;

FIG. 3 is a cross-sectional view taken along the line 3—3 in FIG. 2;

FIG. 4 is a partial elevational view as seen along the line 4—4 in FIG. 2;

FIG. 5 is a bottom view of one of the lead frames in the continuous strip of lead frames shown in FIG. 1 after a substrate has been positioned on the lead frame in a processing step C in that figure;

FIG. 6 is a view similar to FIG. 5 illustrating a substrate circuit device which may be fabricated utilizing the subject invention;

FIG. 8 is a plan view of an apparatus for carrying out the method of the invention;

FIG. 9 is an elevational view of the apparatus shown in FIG. 8;

DETAILED DESCRIPTION

Figure 7:
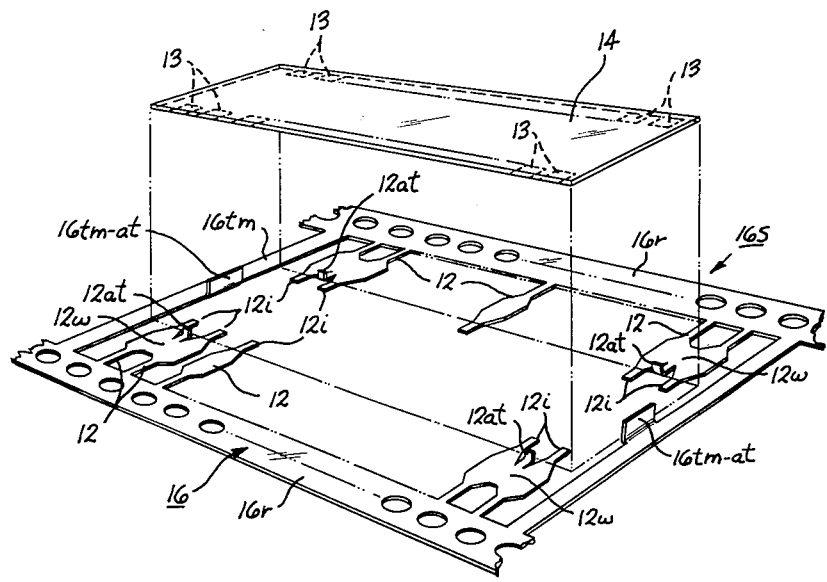
FIG. 7 is an isometric view illustrating a substrate-lead frame aligning step as shown in the processing step C in FIG. 1.

Referring to FIG. 6, the disclosed embodiment of the invention is directed to a system for providing a substrate circuit device generally designated by the reference numeral 11, such as of the thin film type, with first and second sets of leads 12 having inner ends 12i bonded to terminals or bonding pads 13 on a ceramic or other type substrate 14 along opposite edges thereof. The leads 12 also project from the circuit device 11 in spaced parallel relationship to provide lead outer free end portions which are subsequently connected to additional circuitry, not shown. In this regard, however, the apparatus as disclosed in the drawing is only intended to produce a bonded substrate-lead frame configuration as shown in step E of FIG. 1, with the product as shown in FIG. 6 later being produced in other apparatus, not shown, in connection with subsequent processing.

Referring to FIGS. 8 and 9, in the disclosed embodiment of the invention, a preformed continuous flexible strip 16S of lead frames 16, as shown in step A of FIG. 1, is indexed by means of a first reciprocal one-way feed mechanism 17 (FIG. 9) and guideway 18 of a suitable cross-sectional configuration, from a supply reel 19 and sequentially through an aligning tab-bending station 21, a substrate positioning station 22, a lead-terminal bonding station 23, an aligning tab-removal station 24 and a strip-severing station 26. In the strip-severing station 26, the strip 16S of the lead frames 16, having substrates 14 bonded thereto (see step D of FIG. 1), is severed into preselected lengths 16L (one shown in each of FIGS. 8 and 9), which then are loaded or discharged by a second reciprocal one-way feed mechanism 27 into respective slots in an open-ended magazine 28 supported in an elevator mechanism 29.

Referring to step A of FIG. 1, the continuous strip 16S of the lead frames 16 is preformed in suitable punch and die blanking apparatus, not shown, with elongated side rails 16r each having a row of perforations therethrough for use in the advancing of the strip longitudinally, and transversely extending members 16tm interconnecting the side rails at opposite ends of each lead frame in the strip. In addition, first and second sets of leads 12 of each lead frame 16 are integrally connected with respective ones of the side rails 16r and project inwardly from the side rails to provide inner free end portions 12i which are to be bonded to the terminals 13 on a respective one of the substrates 14. The leads 12 also may be coated with a bond-enhancing material, such as gold, in a known manner, to facilitate bonding thereof to the substrate terminals 13.

More specifically, in accordance with the embodiment of the invention shown in FIGS. 1–7, each pair of the leads 12 at the four corners of each of the lead frames 16 is formed in the above-mentioned blanking apparatus with an interconnecting web portion 12w (FIGS. 1 and 2) having an inwardly projecting aligning tab 21at, to provide a pair of these tabs at each end of the lead frame. Each of the tabs 12at is spaced outward from the adjacent inner free ends 12i of its respective leads 12 so as not to interfere with bonding of the inner free end portions of their respective substrate terminals 13 (FIGS. 5 and 6). Further, the transverse rail interconnecting members 16tm at the opposite ends of each lead frame 16 are formed in the above-mentioned blanking apparatus with a pair of opposed aligning tabs 16tm–at (FIGS. 1 and 2).

As the preformed continuous strip 16S of the lead frames 16 is indexed through the guideway 18 (FIGS. 8 and 9) by the feed mechanism 17 (FIG. 9), each of the lead frames is initially advanced into the tab-bending station 21 (FIGS. 8 and 9). In the station 21 the lead frame tabs 12at and 16tm–at, which initially are formed in the plane of the lead frame 16 in the above-mentioned blanking apparatus, as illustrated in step A of FIG. 1 and by broken lines in FIG. 2, are bent upwardly out of the plane of the lead frame so as to project essentially perpendicular thereto, as illustrated in step B of FIG. 1 and in FIGS. 2 (solid lines), 3 and 4. In this regard, as is shown in step C of FIG. 1, the opposed aligning tabs 12at of the lead frame 16 are bent into a spaced relationship corresponding to the width of the substrates 14, and the opposed aligning tabs 16tm–at of the lead frame are bent into a spaced relationship corresponding to the length of the substrates. This bending of the aligning tabs 12at and 16tm–at is accomplished by suitable upper and lower die members 21U (FIGS. 8 and 9) and 21L (FIG. 9) of the tab-bending station 21, which are not shown in detail, the upper die member 21U being vertically movable relative to the lower die member 21L by an air cylinder 21C.

Continued indexing of the strip 16S of the lead frames 16 by the feed mechanism 17 (FIG. 9) subsequently advances each lead frame from the tab-bending station 21 (FIGS. 8 and 9) into the substrate positioning station 22 (FIGS. 8 and 9) for the manual positioning of one of the substrates 14 on the lead frame, as illustrated by the step C in FIG. 1. In this regard, the operator merely positions one of the substrates 14 through a slot 18s (FIG. 8) in the guideway 18, vertically downward onto the lead frame 16 between its aligning tabs 12at and 16tm–at in an inverted position, as illustrated in FIG. 7, that is, with the terminals 13 and the other circuitry of the substrate facing downward so that the terminals engage and rest upon the inner free end portions 12i of the lead frame leads 12. When the substrate 14 is thus positioned, its edges are firmly engaged between portions of the opposed pairs of the aligning tabs 12at and 16tm–at, with the pairs of the first tabs 12at locating the substrate transversely in a first direction extending parallel to the plane of the lead frame 16 and the leads 12, and the pair of the second tabs 16tm–at locating the substrate longitudinally in a second direction extending parallel to the plane of the lead frame and perpendicular to the first direction and the leads of the lead frame, whereby the substrate terminals 13 and the inner free end portions 12i of the lead frame leads 12 are accurately aligned for a bonding operation.

Referring to FIG. 5, which shows one of the lead frames 16 with its respective substrate 14 positioned thereon, as viewed from below, it is seen that the substrate, which is being retained against horizontal movement by the aligning tabs 12at and 16tm–at, rests on the inner free end portions 12*i* of the lead frame leads 12 whereby the substrate can be transported on the lead frame upon each successive indexing of the lead frame strip 16S. Thus, on subsequent indexing of the lead frame strip 16S by the feed mechanism 17 (FIG. 9), each lead frame 16 and its substrate 14 are moved into the lead-terminal bonding station 23 (FIGS. 8 and 9) in which the inner free end portions 12*i* (FIG. 5) of the leads 12 are bonded to the terminals 13 on the substrate to form a substrate-lead frame assembly 14, 16.

Referring to FIG. 9, the bonding station 23 may include thermocompressive bonding apparatus of any suitable type for this purpose, except that a bonding thermode 29*bt* of the apparatus is located below the substrate 14 and the lead frame 16 and is moved upward from below for the bonding operation by an air cylinder 23C, rather than being located above the lead frame and moving downward from above for the bonding operation, as in prior known apparatus. Further, during the bonding operation, the aligning tabs 12*at* and 16*tm–at* (FIGS. 1 and 5) are firmly engaged with the edges of the substrate 14 to retain its terminals 13 in proper alignment with the lead inner free end portions 12*i*. In this connection, since the tabs 12*at* and 16*tm–at* are formed out of the flexible lead frame material, they are capable of flexing movement in response to heat-caused expansion of the substrate 14, so as to preclude cracking of the substrate, which has been a problem prevalent in prior known substrate aligning systems. The heat absorbed by the continuous lead frame strip 16S (FIGS. 1, 8 and 9) during each bonding operation also tends to travel by conduction "upstream" in the direction of the supply reel 19 (FIGS. 8 and 9), thereby providing an inherent preheating of the lead frames 16 subsequently to be bonded, whereby the power level of the bonding apparatus 23 required to achieve satisfactory bonds can be reduced in comparison to prior known bonding system.

Further indexing of the continuous lead frame strip 16S next causes the now bonded substrate 14 and lead frame 16 to be advanced into the tab-removing station 24 (FIGS. 8 and 9). In the tab-removing station 24, the web portion 12*w* (FIGS. 1, 2 and 5) between the corner leads 12 of the lead frame 16, and thus the pairs of the first aligning tabs 12*at*, are clipped from their respective leads, as illustrated by step E in FIG. 1. At the same time, the transverse rail interconnecting members 16*tm* (FIGS. 1, 2 and 5), and thus the pair of aligning tabs 16*tm–at*, are clipped from the side rails 16*r* of the lead frame 16, as illustrated by the step E in FIG. 1. This clipping operation is accomplished by suitable upper and lower punch and die members 24U and 24L (FIG. 9) of the tab-removing station 24, with the upper die member being vertically movable relative to the lower die member by an air cylinder 24C.

After leaving the tab-removing station 24, each bonded substrate 14 and lead frame 16, as shown in the step E of FIG. 1, travels to the strip severing station 26 (FIGS. 8, 9 and 10) in which the lead frame strip 16S is separated into the preselected lengths 16L (one shown in each of FIGS. 8 and 9). For this purpose, the strip severing station 26 includes an upper vertically movable shearing blade 26U (best shown in FIG. 10) mounted upon an upper vertically movable platen 31 (FIG. 10) of the strip severing station. As an air cylinder 26C (FIGS. 8 and 9) is actuated to move the upper shearing blade 26U and the platen 31 downward, horizontally spaced and depending legs of the blade travel through openings in the guideway 18 and then pass between and cooperate with spaced lower fixed shearing blades 26L (FIGS. 9 and 10) to sever the rails 16*r* (FIG. 10) of the lead frame strip 16S between two adjacent ones of the lead frames 16, thereby producing a section of the strip of the desired length 16L. In this regard, while the lead frames 16 may be separated from the strip 16S into individual lengths 16L in the strip severing station 26, in the disclosed embodiment of the invention each length into which the lead frame strip is separated includes a plurality of the lead frames to facilitate handling and subsequent processing, with the air cylinder 26C being actuated on periodic indexes of the strip in a suitable manner for this purpose.

Figure 10:
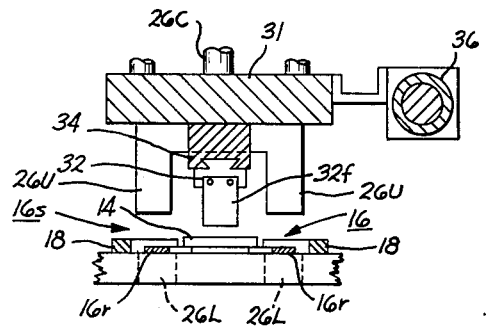
FIG. 10 is a partial enlarged cross-sectional view taken substantially along the line 10—10 in FIG. 9.

As the lead frame strip 16S is advanced by the one-way feed mechanism 17 (FIG. 9), the leading bonded substrate-lead frame assembly (or assemblies) 14, 16 enter the adjacent open end of the magazine 28 (FIGS. 8 and 9) in the elevator mechanism 29, with the side rails 16*r* (FIG. 1) of the strip being received in respective slots (not shown) in opposite sidewalls of the magazine. Then, after the lead frame strip 16S has been severed in the station 26 (FIGS. 8 and 9) to form a strip section of the preselected length 16L, the second horizontally reciprocable one-way feed mechanism 27 is operated to advance the trailing portion of the sheared length into the magazine 28 as illustrated in FIGS. 8 and 9. For this purpose, the second feed mechanism 27 includes a horizontal loading member 32 located centrally above the guideway 18 and secured adjacent a left-hand end thereof, as viewed in FIGS. 8 and 9, on a cantilevered portion of a horizontal support arm 33. The right-hand end of the loading member 32, as viewed in FIGS. 8 and 9, extends into the strip severing station 26 into a guideway 34 fixedly mounted on the upper platen 31 between the depending legs of the upper shearing blade 26U, as illustrated in FIG. 10. The horizontal support arm 33 is secured to an outer end of a piston rod of an air cylinder 36 suitably mounted on the back of the vertically movable platen 31 for movement therewith. Thus, when the air cylinder 26C is actuated to move the vertically movable platen 31 and the upper shearing blade 26U downward during a strip severing operation, the loading member 32 also moves downward to position a depending finger 32*f* (FIG. 10) thereon between two adjacent ones of the substrates 14. The air cylinder 36 is then actuated to move the loading member 32 to the right in FIGS. 8 and 9 to engage the adjacent leading substrate 14 and to complete the discharge of the severed length 16L of the lead frame strip 16S into the magazine 28.

The elevator mechanism 29 may be of any suitable type capable of receiving the open-ended magazine 28 therein and raising (or lowering) the magazine in successive steps for the reception of the severed lengths 16L of the continuous lead frame strip 16S. For example, in FIGS. 8 and 9 the elevator mechanism 29 includes a vertically movable carrier 37 in which the magazine 28 is received. The carrier 37 is slidably mounted on a pair of spaced vertical guide shafts 38 by means of brackets secured to the back of the carrier 37, and is vertically movable by a screw threaded drive shaft 39. The drive shaft 39, which is journaled for rotation adjacent its upper and lower ends, extends through an internally threaded bracket mounted on the back of the carrier 37 and is rotatably driven at its upper end by a suitably controlled, intermittently operated indexing motor 41 (FIG. 9). When the magazine 28, which is open at its opposite ends to facilitate subsequent feeding of the lead frame-substrate lengths 16L therefrom, is removed from the carrier 37, the lead frame-substrate lengths may be retained in the magazine for transfer to another processing station, by suitable magazine end caps (not shown).

The first one-way feed mechanism 17 includes an air cylinder 42 (FIG. 9) mounted beneath the lead frame strip guideway 18 adjacent the operator-attended substrate positioning station 22 and having first and second piston rods 43 and 44 extending from its opposite ends. An outer end of the first piston rod 43 is connected to a small carriage 46, and an outer end of the second piston rod 44 is connected to a similar small carriage 47, each of the carriages being slidably mounted beneath the lead frame strip guideway 18 in suitable guides. Each carriage 46 and 47 includes a pair of spaced drive sprockets 48 which have peripheral lugs for engaging in the apertures in the rails 16r (FIG. 1) of the continuous lead frame strip 16S for advancing the strip. Each pair of drive sprockets 48 is fixedly mounted on a shaft 49 journaled in upstanding spaced brackets 51 on its respective carriage 46 or 47, with upper portions of the drive sprockets and the brackets being disposed in a suitable opening 18o (FIG. 8) in the guideway 18 for horizontal reciprocal movement. Each of the shafts 49 is capable of rotation in a clockwise direction, as viewed in FIG. 9, but is precluded against rotation in a counter-clockwise direction by a one-way clutch mechanism (not shown) mounted thereon adjacent one of its respective mounting brackets 51. Accordingly, when the air cylinder 42 is energized to move the carriages 46 and 47 to the right in FIG. 9, the shafts 49 are precluded from rotation and the sprockets 48 index the continuous lead frame strip 16S through the apparatus one step. However, when the air cylinder 42 is actuated to move the carriages 46 and 47 back to the left in FIG. 9, the shafts 49 "free wheel" and the sprockets 48 roll clockwise relative to the rails 16r of the continuous lead frame strip 16S without imparting any movement thereto. Each of the shafts 49 also may include a manually operable knob (not shown) fixed to one end thereof, for rotating the shaft to advance the continuous lead frame strip 16S through the apparatus manually, as desired.

Figure 11A:
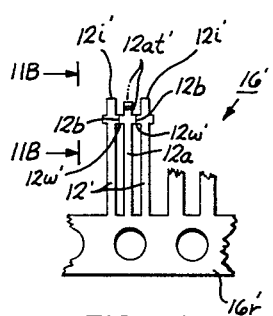
FIGS. 11A and 11B are views similar to FIGS. 2 and 4, respectively, illustrating an alternate embodiment of the invention.
Figure 11B:
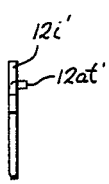

FIGS. 11A, B and C disclose an alternate embodiment of the invention in which a substrate aligning tab 12at' at each corner of a lead frame 16' is formed in the above-mentioned punch and die blanking apparatus (not shown) as an extension of a support arm 12a integrally connected at its outer end to a side rail 16r' of the lead frame. During the forming of the arm 12a as shown in FIG. 11A, web portions 12w' between the arm and respective adjacent leads 12' are severed centrally thereof in a suitable known manner along lines 12b, to preclude the necessity of performing this operation later in the aligning tab-removing station 24 (FIGS. 8 and 9). As in the case of one of the tabs 12at shown in FIGS. 2 and 4, each tab 12at' subsequently is bent out of the plane of the lead frame 16', as shown in FIG. 11B, in the tab-bending station 21 (FIGS. 8 and 9) for substrate alignment purposes. Similarly, referring to FIG. 11C, after bonding pads or terminals 13' of a substrate 14' have been bonded to inner free end portions 12i' of the leads 12' of the leads 12' in the bonding station 23 (FIGS. 8 and 9), each tab 12at' and its support arm 12a are removed from the lead frame 16' by severing the arm at its outer end connection to the lead frame side rail 16r', in the aligning tab-removing station 24 (FIGS. 8 and 9). In the alternative, the tab 12at' and its support arm 12a may be retained with the lead frame 16' and can be removed with the side rail 16r' when it subsequently is severed from the leads 12' to form a substrate circuit device as shown in FIG. 6 by the device 11.

Figure 11C:
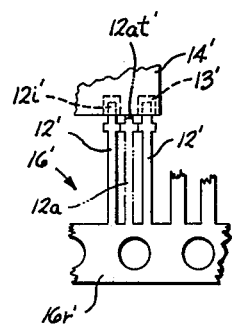
FIG. 11C is a view similar to FIG. 11A illustrating a processing step in accordance with the alternate embodiment of the invention, similar to a processing step E shown in FIG. 1.

In summary, a new and improved system has been disclosed for assembling the inner free end portions 12i (or 12i' in FIGS. 11A, B and C) of the leads 12 of each of the lead frames 16, and the bonding pads or terminals 13 of a respective one of the substrates 14, wherein the opposed pairs of substrate aligning tabs 12at (or 12at' in FIGS. 11A, B and C) and 16tm–at are formed integrally with the lead frame, as illustrated by the steps A and B of FIG. 1. Since the aligning tabs 12at (or 12at') and 16tm–at are formed from the flexible lead frame strip 16S, and thus have a certain degree of flexibility, they can firmly engage the edges of the substrate 14 to achieve accurate alignment of the lead end portions 12i and the bonding terminals 13, and still flex sufficiently in response to heat-caused expansion of the substrate during a bonding operation, to preclude the possibility of cracking of the substrate. In addition, after use of the tabs 12at and 16tm–at of each of the lead frames 16 for a respective aligning and bonding operation, as illustrated in steps C and D of FIG. 1, respectively, the tabs are removed from the lead frame, as illustrated in the step E in FIG. 1. (Similarly, the tabs 12at' are removed as illustrated in FIG. 11C). Accordingly, alignment errors due to the necessity for providing clearance between alignment pins and substrate edges, or due to wear of the alignment pins from repetitious engagement of the pins by successive ones of the substrates 14, as in prior alignment systems, is eliminated. In addition, in the bonding of the substrates 14 to the lead frames 16 in the bonding station 23 (FIGS. 8 and 9), heat which is absorbed by the lead frame strip 16S travels by conduction through the strip "upstream" toward the supply reel 19 (FIGS. 8 and 9) to provide an inherent preheating of the lead frames subsequently to be bonded, whereby the power level required to achieve satisfactory bonds is reduced in comparison to prior known bonding systems.

More specifically, in the disclosed embodiment of the invention, the forming of the aligning tabs 12at (or 12at' in FIGS. 11A, B and C) and 16tm–at is readily accomplished by first preforming the tabs in the plane of the lead frames 16 simultaneously with the preforming of the continuous strip 16S of the lead frames, as illustrated by the step A of FIG. 1, in the above-mentioned separate punch and die blanking apparatus (not shown). The continuous lead frame strip 16S then can readily be stored on the supply reel 19 (FIGS. 8 and 9), and/or fed from the supply reel in successive steps to facilitate the bonding of the lead frame leads 12 and the substrate terminals 13 automatically. For example, the aligning tabs 12at (or 12at') and 16tm–at of each lead frame 16 are readily bent upward out of the plane of the lead frame for the reception of their respective substrate 14 in the tab-bending station 21 (FIGS. 8 and 9), as illustrated by the step B in FIG. 1. As is shown in FIG. 7, the substrate 14 then is positioned between the upwardly projecting aligning tabs 12at (or 12at') and 16tm–at in an inverted position in the station 22 (FIGS. 8 and 9), so that the substrate terminals 13 face downward to engage and rest upon the inner free end portions 12i of the lead frame leads 12, as illustrated by the step C in FIG. 1, and as shown in FIG. 5. Accordingly, the lead frame strip 16S then can be utilized to transport the substrate 14 into the lead-terminal bonding station 23 (FIGS. 8 and 9) in proper position for the automatic bonding of the substrate terminals 13 of the lead frame leads 12, as illustrated by the step D in FIG. 1. Similarly, the continuous lead frame strip 16S subsequently can be used to transport the bonded substrate 14 into the tab-removal station 24 (FIGS. 8 and 9) for automatic removal of the tabs 12at (or 12at') and 16tm-at, as illustrated by the step E in FIG. 1, and then into the strip severing station 26 (FIGS. 8 and 9), from which the severed lengths 16L of the strip are automatically loaded by the second feed mechanism 27 into the magazine 28 in the elevator mechanism 29. Subsequently, when the magazine 28 has become filled, it is replaced in the elevator mechanism 29 with an empty magazine, and the lengths 16L of the continuous lead frame strip 16S are transferred, by means of the magazine, to another area for subsequent processing operations, including the forming of the substrate circuit device 11 as shown in FIG. 6.

What is claimed is:

1. A method of assembling leads of an essentially planar lead frame with respective terminals on a substrate, which comprises the steps of:
    forming first aligning tab portions on the lead frame in preselected spaced relationship such that the first tab portions will locate the substrate in a first direction extending parallel to the plane of the lead frame to align the terminals of the substrate with their respective leads of the lead frame when the substrate is engaged with the first tab portions;
    forming second aligning tab portions on the lead frame in preselected spaced relationship such that the second tab portions will locate the substrate in a second direction extending parallel to the plane of the lead frame and perpendicular to the first direction to align the terminals of the substrate with their respective leads when the substrate is engaged with the second tab portions; and
    positioning the substrate in engagement with the first and second aligning tab portions on the lead frame to align the terminals of the substrate with their respective leads of the lead frame.

2. A method as recited in claim 1, in which the forming of the first and second aligning tab portions includes the steps of:
    initially forming aligning tabs on the lead frame in the plane of the lead frame; and
    bending the aligning tabs on the lead frame out of the plane of the lead frame so that first and second aligning tab portions of the tabs project from the plane of the lead frame in preselected spaced relationship.

3. A method as recited in claim 1, in which the forming of the first and second aligning tab portions includes the steps of:
    forming a first pair of opposed aligning tabs on the lead frame to locate the substrate in the first direction extending parallel to the plane of the lead frame; and
    forming a second pair of opposed aligning tabs on the lead frame to locate the substrate in the second direction extending parallel to the plane of the lead frame and perpendicular to the first direction.

4. A method as recited in claim 3, in which:
    the substrate is positioned between the pairs of aligning tabs with opposite edges of the substrate engaged with respective ones of the tabs.

5. A method as recited in claim 1, which comprises the additional step of:
    bonding the aligned lead frame leads and substrate terminals to one another.

6. A method of assembling leads of a lead frame with respective terminals on a substrate, which comprises the steps of:
    forming aligning tabs on the lead frame in preselected spaced relationship such that the tabs will locate the substrate to align the terminals of the substrate with their respective leads of the lead frame when the substrate is engaged with the tabs in a predetermined manner;
    positioning the substrate in engagement with the aligning tabs on the lead frame in the predetermined manner to align the terminals of the substrate with their respective leads of the lead frame;
    bonding the aligned lead frame leads and substrate terminals to one another; and
    removing the aligning tabs from the lead frame subsequent to the bonding of the leads on the lead frame to the terminals on the substrate.

7. A method of assembling leads of each lead frame in a continuous strip of lead frames with respective terminals on a substrate, which comprises the steps of:
    forming aligning tabs on each of the lead frames in preselected spaced relationship such that the tabs project upwardly from the lead frame and will locate the substrate to align the terminals of the substrate with their respective leads of the lead frame when the substrate is engaged between the upwardly projecting tabs;
    positioning the substrate between the upwardly projecting aligning tabs on the lead frame with the terminals of the substrate facing downward to align the terminals of the substrate with their respective leads of the lead frame;
    supporting the downwardly facing terminals of the substrate on the leads of the lead frame for the bonding of the terminals to the leads; and
    bonding the lead frame leads and substrate terminals to one another from below.

8. A method as recited in claim 7, which comprises the additional step of:
    advancing the continuous strip of lead frames to transport the substrates positioned thereon into a bonding station.

9. A method as recited in claim 8, which comprises the additional step of:
    removing the aligning tabs from each lead frame subsequent to the bonding of the leads on the lead frame to the terminals on its respective substrate; and in which
    the advancing of the continuous strip of lead frames also transports the bonded substrates from the bonding station into a tab-removing station.

10. In an essentially planar lead frame having a plurality of spaced leads which are to be bonded to respective terminals of a substrate, the improvement which comprises:
    first aligning tab portions integral with the lead frame and projecting therefrom in preselected spaced relationship to locate the substrate in a first direction extending parallel to the plane of the lead frame such that the terminals of the substrate will be aligned with the leads of the lead frame; and
    second aligning tab portions integral with the lead frame and projecting therefrom in preselected spaced relationship to locate the substrate in a second direction extending parallel to the plane of the lead frame and perpendicular to the first direction.

11. A lead frame as recited in claim 10, in which:
said first aligning tab portions form parts of a first pair of aligning tabs which project from the lead frame in a preselected spaced relationship measured in the first direction extending parallel to the plane of the lead frame; and
said second aligning tab portions form parts of a second pair of aligning tabs which project from the lead frame in a preselected spaced relationship measured in the second direction extending parallel to the frame of the lead frame and perpendicular to the first direction.

12. In a lead frame having an essentially planar configuration and a plurality of spaced leads which are to be bonded to respective terminals of a substrate, the improvement which comprises:
a plurality of pairs of aligning tabs integral with the lead frame and projecting from the lead frame out of the plane of the lead frame to locate the substrate such that the terminals of the substrate will be aligned with the leads of the lead frame;
at least one of said pairs of aligning tabs projecting from the lead frame out of the plane of the lead frame in a preselected spaced relationship measured in a first direction; and
at least one of said pairs of aligning tabs projecting from the lead frame out of the plane of the lead frame in a preselected spaced relationship measured in a second direction perpendicular to the first direction.

13. In a lead frame having a plurality of spaced leads which are to be bonded to respective terminals of a substrate, wherein the lead frame includes opposed sets of leads extending inwardly toward one another from first opposite side portions of the lead frame and having inner free end portions, and includes second opposite side portions extending parallel to the leads and interconnecting the first side portions, the improvement which comprises:
a plurality of pairs of aligning tabs integral with the lead frame and projecting therefrom to locate the substrate such that the terminals of the substrate will be aligned with the leads of the lead frame;
at least one of said pair of said aligning tabs projecting from the lead frame in a preselected spaced relationship measured in a first direction;
at least one of said pairs of said aligning tabs projecting from the lead frame in a preselected spaced relationship measured in a second direction perpendicular to the first direction;
each tab of said first pair of aligning tabs being located between portions of a pair of adjacent ones of the leads in a respective one of the opposed sets of the leads; and each tab of said second pair of aligning tabs projecting from a respective one of the second opposite side portions.

14. A lead frame as recited in claim 13, in which:
each tab of said first pair of aligning tabs is located in outer spaced relationship to the inner free end portions of its respective leads.

15. Apparatus for bonding leads of a lead frame to respective terminals on a substrate, which comprises:
means for forming aligning tabs on the lead frame in preselected spaced relationship such that the tabs locate the substrate to align the terminals of the substrate with their respective leads of the lead frame when the substrate is engaged with the tabs in a predetermined manner;
means for bonding the terminals on the substrate to the leads of the lead frame when the substrate is engaged with the aligning tabs in the predetermined manner; and
means for removing the aligning tabs from the lead frame after the terminals of the substrate and the leads of the lead frame have been bonded by said bonding means.

16. Apparatus as recited in claim 15, in which the lead frame is one of a continuous strip of lead frames, and which further comprises:
means for advancing the continuous strip of lead frames to feed the lead frames to said tab forming means in succession, to feed the continuous strip of lead frames and respective substrates supported thereon to said bonding means in succession, and to feed the continuous strip of bonded lead frames and substrates to said tab removing means in succession.

17. Apparatus as recited in claim 16, in which each of the lead frames is of essentially planar configuration, and in which:
said tab-forming means bends said aligning tabs on each lead frame to project upward out of the plane of the lead frame.

18. Apparatus as recited in claim 17, which further comprises:
means for severing the continuous strip of lead frames to a length including at least one of the lead frames after the leads of the one lead frame have been bonded to the terminals of its respective substrate by said bonding means and the aligning tabs of the one lead frame have been removed by said tab-removing means;
said strip advancing means also causing feeding of the continuous strip of lead frames and their respective substrates to said strip severing means in succession; and
means for feeding the severed lengths of the lead frame strip from said strip severing means to a discharge position.

* * * * *